United States Patent
Foley et al.

(10) Patent No.: US 10,496,482 B1
(45) Date of Patent: Dec. 3, 2019

(54) SELECTIVE RAID REPAIR BASED ON CONTENT MAPPING

(71) Applicant: EMC IP Holding Company LLC, Hopkinton, MA (US)

(72) Inventors: Robert P. Foley, Clinton, MA (US); Peter Puhov, Shrewsbury, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 194 days.

(21) Appl. No.: 15/281,951

(22) Filed: Sep. 30, 2016

(51) Int. Cl.
*G06F 11/00* (2006.01)
*G06F 11/10* (2006.01)
*G11C 29/52* (2006.01)
*G06F 3/06* (2006.01)

(52) U.S. Cl.
CPC ........ *G06F 11/1092* (2013.01); *G06F 3/0619* (2013.01); *G06F 3/0665* (2013.01); *G06F 3/0689* (2013.01); *G06F 11/1072* (2013.01); *G11C 29/52* (2013.01)

(58) Field of Classification Search
USPC ........................................ 714/6.2, 6.22, 6.23
See application file for complete search history.

(56) References Cited

U.S. PATENT DOCUMENTS

| | | | |
|---|---|---|---|
| 8,788,913 B1 | 7/2014 | Xin et al. | |
| 9,378,093 B2 | 6/2016 | Cooper et al. | |
| 9,632,891 B2 | 4/2017 | Thomas et al. | |
| 9,720,596 B1 | 8/2017 | Bono et al. | |
| 9,804,939 B1 | 10/2017 | Bono et al. | |
| 2005/0102551 A1* | 5/2005 | Watanabe | G06F 3/0607 714/6.2 |
| 2014/0089809 A1* | 3/2014 | Levy | G06Q 10/10 715/736 |
| 2014/0281311 A1* | 9/2014 | Walker | G06F 3/0631 711/162 |
| 2015/0269025 A1* | 9/2015 | Krishnamurthy | G06F 11/1092 714/6.24 |
| 2016/0246678 A1* | 8/2016 | Galbraith | G06F 3/0619 |
| 2017/0003889 A1* | 1/2017 | Kim | G06F 3/0611 |
| 2017/0060474 A1* | 3/2017 | Yamamoto | G06F 3/0652 |

* cited by examiner

Primary Examiner — Sarai E Butler
(74) Attorney, Agent, or Firm — BainwoodHuang (57) ABSTRACT

A technique for managing RAID storage in a data storage system provides a mapping subsystem and a RAID subsystem and employs the mapping subsystem to direct repair operations on damaged RAID stripes. The mapping subsystem stores metadata that provides information about data stored in the RAID subsystem and locations of that data on RAID stripes. In response to detection of a damaged RAID stripe, the mapping subsystem selectively determines, based on the metadata, whether to perform repair operations or to avoid repair operations. As many repair operations can safely be avoided, the disclosed technique has the effect of reducing unnecessary processing in the data storage system. When the RAID subsystem includes flash drives, the technique also reduces write amplification, thus preserving flash drives which might otherwise be subject to premature wear.

21 Claims, 4 Drawing Sheets

SELECTIVE RAID REPAIR BASED ON CONTENT MAPPING

BACKGROUND

Data storage systems are arrangements of hardware and software that include storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, deleted, and so forth. Software running on the storage processors manages incoming storage requests and performs various data processing tasks to organize and secure the data elements stored on the non-volatile storage devices.

Data storage systems commonly arrange non-volatile storage according to RAID protocols. As is known, "RAID" is an acronym for Redundant Array of Independent (or sometimes Inexpensive) Disks. For example, a data storage system may render storage regions of a disk drive as multiple RAID elements, which the data storage system combines with RAID elements from other disk drives to form RAID stripes. Each RAID stripe may store data redundantly, e.g., by designating one or more elements for storing data and one or more elements for storing mirrored data or parity. In the event of damage to a RAID element of a RAID stripe, RAID protocols act to repair the stripe by rebuilding the data formerly stored in the failed element onto a new element, which may have been provided as a spare. If redundancy is achieved using mirroring, rebuilding may involve copying data from another element onto the new element. If redundancy is achieved using parity, rebuilding may involve computing data for the new element, e.g., as a bitwise exclusive-OR of corresponding regions from other elements in the stripe, and writing the results to the new element.

SUMMARY

Some data storage systems are constructed with a mapping layer and a separate RAID layer. The mapping layer translates logical addresses of host-accessible data objects (e.g., LUNs (Logical UNits), file systems, virtual machine disks, etc.) to corresponding physical storage locations in the RAID layer. The RAID layer provides access to stored data from its constituent disk drives and maintains RAID stripes in working order. In such systems, the mapping layer may be largely unaware of occurrences that take place in the RAID layer, and vice-versa. For example, if a disk drive that supplies RAID elements becomes damaged, the RAID layer rebuilds the damaged elements, typically doing so transparently to the mapping layer, which may not even be alerted of the damaged drive.

Unfortunately, lack of coordination between the mapping layer and the RAID layer of a data storage system can lead to inefficiencies. For example, when a RAID element on a RAID stripe fails, the data storage system may rebuild the failed element, regardless of the fact that the mapping layer may no longer require the data that it stores. As a result, a greater number of repair operations may be performed than are necessary. Also, when the disk drives used by the RAID layer include flash drives, performing unnecessary repair operations may increase write amplification in those drives, contributing to their premature wear and early mortality.

In contrast with the above-described prior approach, an improved technique for managing RAID storage in a data storage system provides a mapping subsystem and a RAID subsystem and employs the mapping subsystem to direct repair operations on damaged RAID stripes in the RAID subsystem. The mapping subsystem stores metadata that provides information about data stored in the RAID subsystem and locations of that data on RAID stripes. In response to detection of a damaged RAID stripe, the mapping subsystem selectively determines, based on the metadata, whether to perform repair operations or to avoid repair operations. As many repair operations can be safely avoided, the improved technique has the effect of reducing unnecessary processing in the data storage system. When the RAID subsystem includes flash drives, the technique also reduces write amplification, thus preserving flash drives which might otherwise be subject to premature wear.

Certain embodiments are directed to a method of managing RAID storage in a data storage system. The method includes receiving, by the data storage system, IO requests specifying host data to be written to respective logical addresses of a set of data objects stored in the data storage system. In response to receiving the IO requests, the method further includes updating map metadata maintained by a mapping subsystem of the data storage system. The map metadata associates logical address ranges of the set of data objects with respective RAID stripes managed by a RAID subsystem that stores the host data. In response to a detection of damage in a RAID stripe by the RAID subsystem, the method still further includes performing a repair-qualifying operation. The repair-qualifying operation is configured to (i) direct the RAID subsystem to repair the damaged RAID stripe in response to the map metadata maintained by the mapping subsystem indicating a first condition and (ii) avoid repairing of the damaged RAID stripe in response to the map metadata maintained by the mapping subsystem indicating a second condition.

Other embodiments are directed to a data storage system constructed and arranged to perform a method of managing RAID storage, such as the method described above. Still other embodiments are directed to a computer program product. The computer program product stores instructions which, when executed on control circuitry of a data storage system, cause the data storage system to perform a method of managing RAID storage, such as the method described above.

The foregoing summary is presented for illustrative purposes to assist the reader in readily grasping example features presented herein; however, it is not intended to set forth required elements or to limit embodiments hereof in any way.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views.

DETAILED DESCRIPTION OF THE INVENTION

Embodiments of the invention will now be described. It should be appreciated that such embodiments are provided by way of example to illustrate certain features and principles of the invention but that the invention hereof is not limited to the particular embodiments described.

An improved technique for managing RAID storage in a data storage system provides a mapping subsystem and a RAID subsystem and employs the mapping subsystem to direct repair operations on damaged RAID stripes in the RAID subsystem. The mapping subsystem stores metadata that provides information about data stored in the RAID subsystem and locations of that data on RAID stripes. In response to detection of a damaged RAID stripe, the mapping subsystem selectively determines, based on the metadata, whether to perform repair operations or to avoid repair operations.

Figure 1:
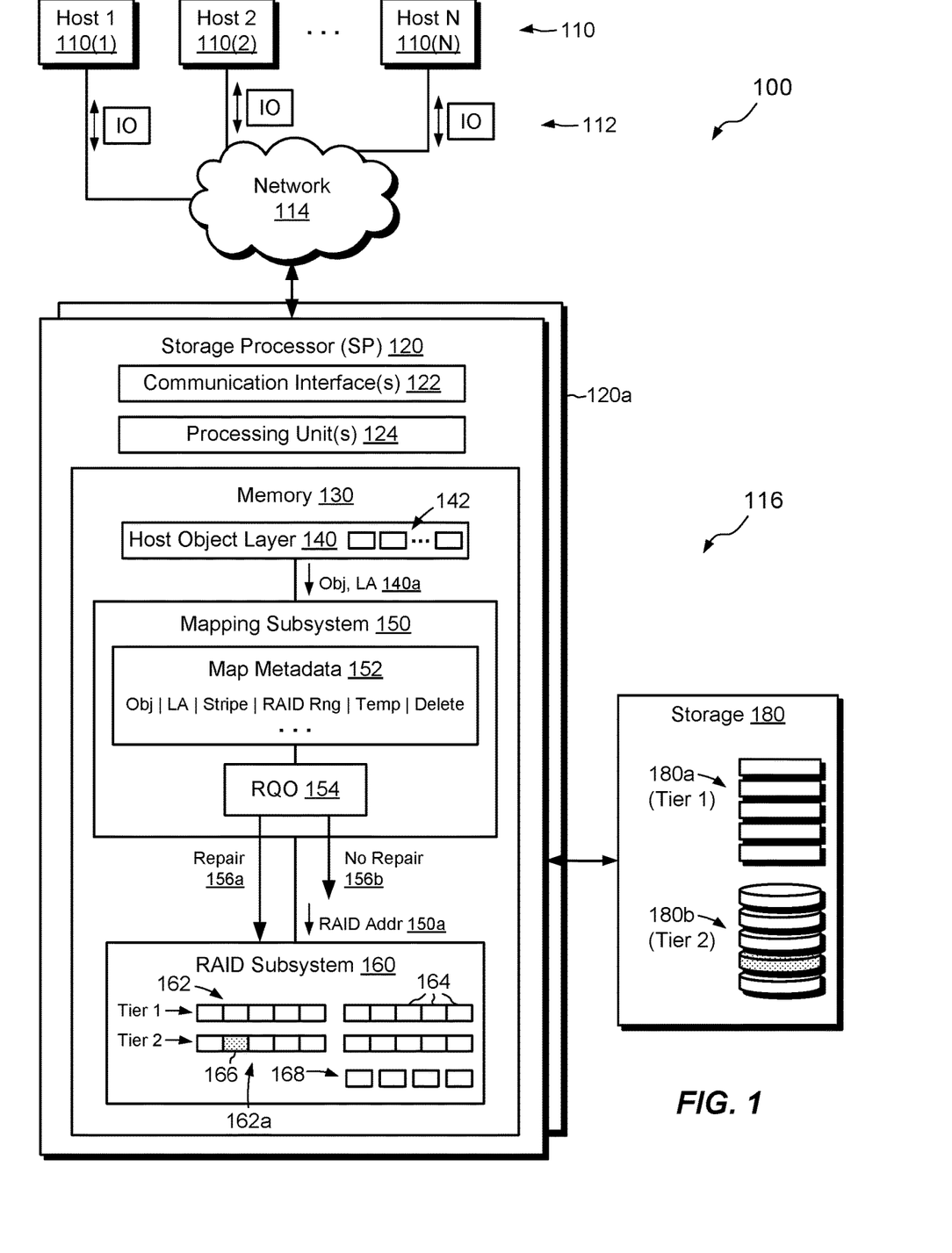
FIG. 1 is a block diagram of an example environment in which embodiments of the improved technique hereof can be practiced.

FIG. 1 shows an example environment 100 in which embodiments of the improved technique hereof can be practiced. Here, multiple host computing devices ("hosts") 110 access a data storage system 116 over a network 114. The data storage system 116 includes a storage processor, or "SP," 120 and storage 180, such as magnetic disk drives, electronic flash drives, and the like. In some examples, the storage 180 is arranged in storage tiers, with each storage tier providing a respective quality of service. For example, the storage 180 may include a first storage tier 180a (Tier 1) backed by flash drives and a second storage tier 180b (Tier 2) backed by magnetic disk drives. Although two storage tiers are shown, the storage 180 may provide any number of storage tiers. Also, although five disk drives are shown in each tier, the storage 180 may include any number of disk drives in each tier. Different numbers of disk drives may be provided in different tiers. The particular numbers of drives shown in the figure are limited for the sake of simplicity.

The data storage system 116 may include multiple SPs like the SP 120 (e.g., a second SP 120a). In an example, multiple SPs may be provided as circuit board assemblies, or "blades," which plug into a chassis that encloses and cools the SPs. The chassis has a backplane for interconnecting the SPs, and additional connections may be made among SPs using cables. It is understood, however, that no particular hardware configuration is required, as any number of SPs may be provided, including a single SP, and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110 may connect to the SP 120 using various technologies, such as Fibre Channel, iSCSI, NFS, and CIFS, for example. Any number of hosts 110 may be provided, using any of the above protocols, some subset thereof, or other protocols besides those shown. As is known, Fibre Channel and iSCSI are block-based protocols, whereas NFS and CIFS are file-based protocols. The SP 120 is configured to receive IO requests 112 (i.e., 112(1) through 112(N)) according to block-based and/or file-based protocols and to respond to such IO requests 112 by reading or writing the storage 180.

The SP 120 is seen to include one or more communication interfaces 122, a set of processing units 124, and memory 130. The communication interfaces 122 include, for example, SCSI target adapters and network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs. The memory 130 includes both volatile memory (e.g., RAM), and non-volatile memory, such as one or more ROMs, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by operation of software instructions, a host object layer 140, a mapping subsystem 150, and a RAID subsystem 160. The host object layer 140 is constructed and arranged to provide access to host data objects 142, whose data are stored in the storage 180. The host data objects 142 may include, for example, host-accessible LUNs (Logical UNits), file systems, virtual machine disks, and the like. Hosts 110 may access the data objects 142 over the network 114 by identifying the data object 142, e.g., by name or handle, and by specifying a logical address (LA) into the specified data object.

The mapping subsystem 150 is constructed and arranged to convert logical addresses 140a from the host object layer 140 into corresponding RAID addresses 150a in the RAID subsystem 160. The mapping subsystem 150 includes mapping structures (not shown) for organizing data objects, e.g., into blocks, files, and/or directories and the like (depending on the type of data object). The mapping subsystem 150 also includes map metadata 152. The map metadata 152 associates data portions at particular logical address ranges (LA's) of data objects 142 (Obj's) with various characteristics. In an example, these may characteristics include, for each mapped data portion of each data object 142:

- The RAID stripe (Stripe) on which that data portion has been placed (e.g., one of stripes 162). RAID stripes may be any size. In some implementations, they may be 4 MB or 8 MB, for example.
- The RAID address range (RAID Rng) on which that data portion has been placed. This range is typically smaller than a stripe, such as 4 KB, 8 KB, 16 KB, 32 KB, or 64 KB, for example.
- The data temperature (Temp) of that data portion. Data temperature reflects a level of access to the respective data portion, such as a frequency of read requests and/or write requests directed to that data portion.
- A delete flag (Delete) that indicates whether that data portion has been flagged for deletion. For example, the data storage system 116 may queue certain content for deletion and mark that content in the map metadata 152.

In an example, the map metadata 152 is stored in persistent memory (e.g., in storage 180), but portions thereof are maintained in volatile system memory to enable fast access. Also, although depicted as a simple table, one should appreciate that the map metadata 152 may have a multi-layer structure and may have any level of complexity. The example shown is intended merely to be illustrative.

The RAID subsystem 160 is constructed and arranged to organize host data of host-accessible data objects 142 in RAID stripes 162, which are addressed using RAID addresses 150a. Each RAID address 150a may specify, for example, a particular RAID stripe 162 and an offset (e.g., logical block address, or LBA) into that RAID stripe 162. Multiple RAID stripes 162 are shown, with the understanding that the RAID subsystem 160 may manage hundreds, thousands, or even millions of RAID stripes 162, for example. The stripes 162 may be derived from RAID groups (i.e., groups of disk drives arranged according to RAID protocols); however, this is not required. For example, the RAID subsystem 160 may provide RAID stripes 162 as part of a fully-mapped RAID system in which stripes 162 are created from free extents derived from disk drives in storage 180. Five extents 164 per stripe 162 are shown, although the number of extents 164 per stripe 162 may vary based on RAID configuration. The RAID subsystem 160 may maintain a pool of free extents 168. The free extents 168 are uncommitted to any RAID stripe 162 but are available as spares, e.g., in the event of a disk drive failure. For example, if a disk drive in storage 180 fails, the RAID subsystem 160 may identify any stripes 162 that include extents 164 backed by the failed disk drive and may then proceed to repair those damaged stripes using RAID protocols. Repairing a damaged RAID stripe generally entails rebuilding the data of the damaged extent onto a spare extent and replacing the damaged extent with the rebuilt spare extent in the RAID stripe. Operation of the RAID stripe may then continue, with full redundancy restored.

As one skilled in the art will appreciate, repairing damaged RAID stripes can be an intensive process, which can consume valuable processor and memory resources. Also, repairing stripes backed by flash drives can induce large numbers of writes to spare extents, which may have to be written over their entire range. Such writes to flash induce write amplification, which promotes wear in flash drives and thus early failure.

In accordance with further improvements hereof, repair of damaged RAID stripes 162 can be reduced or avoided through the application of map metadata 152 in the mapping subsystem 150. In example operation, the hosts 110 issue IO requests 112 to the data storage system 116. The IO requests 112 include requests to read and write specified locations (LAs) of host data of host-accessible data objects 142. The SP 120 receives the IO requests 112 at the communication interfaces 122 and initiates further processing. For example, the mapping subsystem 150 maps the logical addresses of the specified data objects 142 to corresponding RAID addresses 150a (e.g., stripes 162 and associated LBAs), and the RAID subsystem 160 maps the RAID addresses 150a to corresponding disk drive locations in storage 180, where the requested read or write operations take place. As the mapping subsystem 150 performs its mapping and other functions, the mapping subsystem 150 maintains map metadata 152, e.g., by populating information in the illustrated table. For instance, the mapping subsystem 150 stores RAID stripe, RAID range, data temperature, and/or delete flag status for each data portion of each data object 142 and logical address range (LA). One should appreciate that different embodiments may store different information from that shown in the map metadata 142. The example is merely illustrative. Also, the map metadata 152 may store information about only a subset of data objects 142, including a single data object 142. Further, the map metadata 152 may populate information for certain LA ranges but not others. Thus, there is no requirement that the map metadata 152 be fully populated.

At some point during operation of data storage system 116, a RAID stripe 162a may become damaged. For example, a disk drive (shaded) in storage 180 may fail. When this disk drive fails, any or all of the RAID extents 164 derived from the failed disk drive may be affected. Here, a single extent 166 (shaded) is seen to be affected. Failure of this extent 166 compromises the RAID stripe 162a, of which it is a part.

The RAID subsystem 160 may alert the mapping subsystem 150 of the damaged RAID stripe 162a. In response, the mapping subsystem 150 performs a repair-qualifying operation (RQO) 154. The repair-qualifying operation 154 receives input from the map metadata 152 and proceeds to direct the RAID subsystem 150 to repair (arrow 156a) the damaged stripe 162a based on the map metadata 152 indicating a first condition. Alternatively, the repair-qualifying operation 154 may avoid repair (arrow 156b) of the damaged RAID stripe 160a based on the map metadata 152 indicating a second condition. In an example, the repair-qualifying operation 154 analyzes the map metadata 152 to determine whether the first condition or the second condition is satisfied. In some examples, the repair-qualifying operation 154 receives and analyzes other metadata, activities, and/or information in determining which condition is satisfied.

If the first condition is satisfied (arrow 156a), repair of RAID stripe 162a may proceed in the usual way. For example, the RAID subsystem 160 rebuilds the data of the damaged extent 166 onto a spare extent 168 (e.g., by copying or performing bitwise exclusive-OR). Once rebuilding is complete, the RAID subsystem 160 incorporates the spare extent into the RAID stripe 160a.

In some examples, repair of the damaged stripe 162a benefits from map metadata 152. For example, map metadata 152 may indicate that only a subset of all possible storage locations on failed extent 166 are actually in use. Rebuild activities may then focus only on those areas, i.e., by writing repair data to the spare extent only for the areas that the map metadata 152 indicates are populated. Reducing the amount of rebuilt data can significantly improve performance and help to preserve flash drives.

If the second condition is satisfied (arrow 156b), no repair is performed on stripe 160a. Rather, other activities may be performed instead, as informed by the map metadata 152.

In a simple case, the second condition is satisfied when the map metadata 152 indicates that no current data is stored in RAID stripe 162a. In this case, the RAID stripe 162a can be freed. For example, the repair-qualifying operation 154 (or some follow-on operation) directs the RAID subsystem 160 to break down the RAID stripe 162a, such that its damaged extent 166 is taken offline and its undamaged extents are provided as new spares 168.

In another example, the second condition is satisfied when the map metadata 152 indicates that RAID stripe 162a does store mapped data, but all of the data stored on the stripe 162a is marked for deletion. In this case, the RAID stripe 162*a* may be freed, e.g., using the procedure described above, and the map metadata 152 may be updated to reflect the deletions.

In yet another example, the second condition is satisfied when the map metadata 152 indicates that RAID stripe 162*a* does store some mapped data, but the amount of such data is small, i.e., less than a predetermined threshold amount. The threshold may be expressed in absolute terms (e.g., as a number of bytes, blocks, etc.), as a percentage of the total size of the stripe 162*a*, or in any other suitable way. In addition, the threshold may be variable, e.g., based on system load or other considerations. If the amount of data is less than the threshold, the repair-qualifying operation 154 may direct the RAID subsystem 160 to relocate the data on the stripe 162*a* to other locations, e.g., on some other stripe (or stripes) having available space. The repair-qualifying operation 154 updates the map metadata 152 to reflect the new locations (e.g., Stripe and RAID Addr) of the relocated data. Once relocation of all data from stripe 162*a* is complete, the repair-qualifying operation 154 may direct the RAID subsystem 160 to free the RAID stripe 162*a*, e.g., in the manner described above.

In yet another example, the second condition is satisfied when the map metadata 152 indicates that RAID stripe 162*a* does store data, but that the temperature of the data stored on stripe 162*a* indicates that the data would be more efficiently placed on a different storage tier. For example, if stripe 162*a* is derived from Tier 2 storage (magnetic disk drives) and the temperature of the data on stripe 162*a* is warm, the repair-qualifying operation 154 may relocate the data to available space on Tier 1 storage (flash drives). Likewise, if stripe 162*a* is derived from Tier 1 storage (flash drives) and the temperature of the data on stripe 162*a* is cold, the repair-qualifying operation 154 may relocate the data to available space on Tier 2 storage (magnetic disk drives). In either case, repair of stripe 162*a* is avoided. Once all the data from stripe 162*a* is relocated to a different tier, the RAID subsystem 160 may free the stripe 162*a*, e.g., in the manner described above.

Although the examples provided above describe decisions to move or to re-tier data at per-stripe level granularity (e.g., applying to all data on the stripe 162*a* or to none of it), such decisions may also be made at other levels of granularity. For example, the map metadata 152 may store address ranges in increments smaller than stripes, e.g., in increments of 4 KB, 8 KB, 16 KB, 32 KB, or 64 KB, for example. Accordingly, the repair-qualifying operation 154 may treat different increments of storage on RAID stripe 162*a* differently. For instance, fine-grain increments of data may be relocated individually to other storage tiers (e.g., by tiering up and/or tiering down), and/or other data increments may be relocated to other stripes of the same tier. Thus, there is no need to treat all data on the stripe 162*a* the same way.

In addition, some data may be relocated while other data may remain. Thus, stripe 162*a* may be only partially emptied of data. After directing the RAID subsystem 160 to relocate some of the data on stripe 162*a*, the repair-qualifying operation 154 may then direct the RAID subsystem 160 to repair the RAID stripe 162*a*, with repair operations focusing only on the data that the map metadata 152 indicates are still present. Such repair operations may be significantly less burdensome, however, than they would be if it had been necessary to rebuild all of the data originally on the stripe 162*a*, and may result in much less write amplification when rebuilding operations are performed on flash drives.

In the manner described, the use of map metadata 152 enables the mapping subsystem 150 to drive RAID repair and to make intelligent decisions as to whether to repair or not, whether to relocate data, whether to re-tier, and so forth. Providing the mapping subsystem 150 with map metadata 152 thus promotes efficient use of resources in the data storage system 116 and helps to protect flash drives from premature wear.

Figure 2:
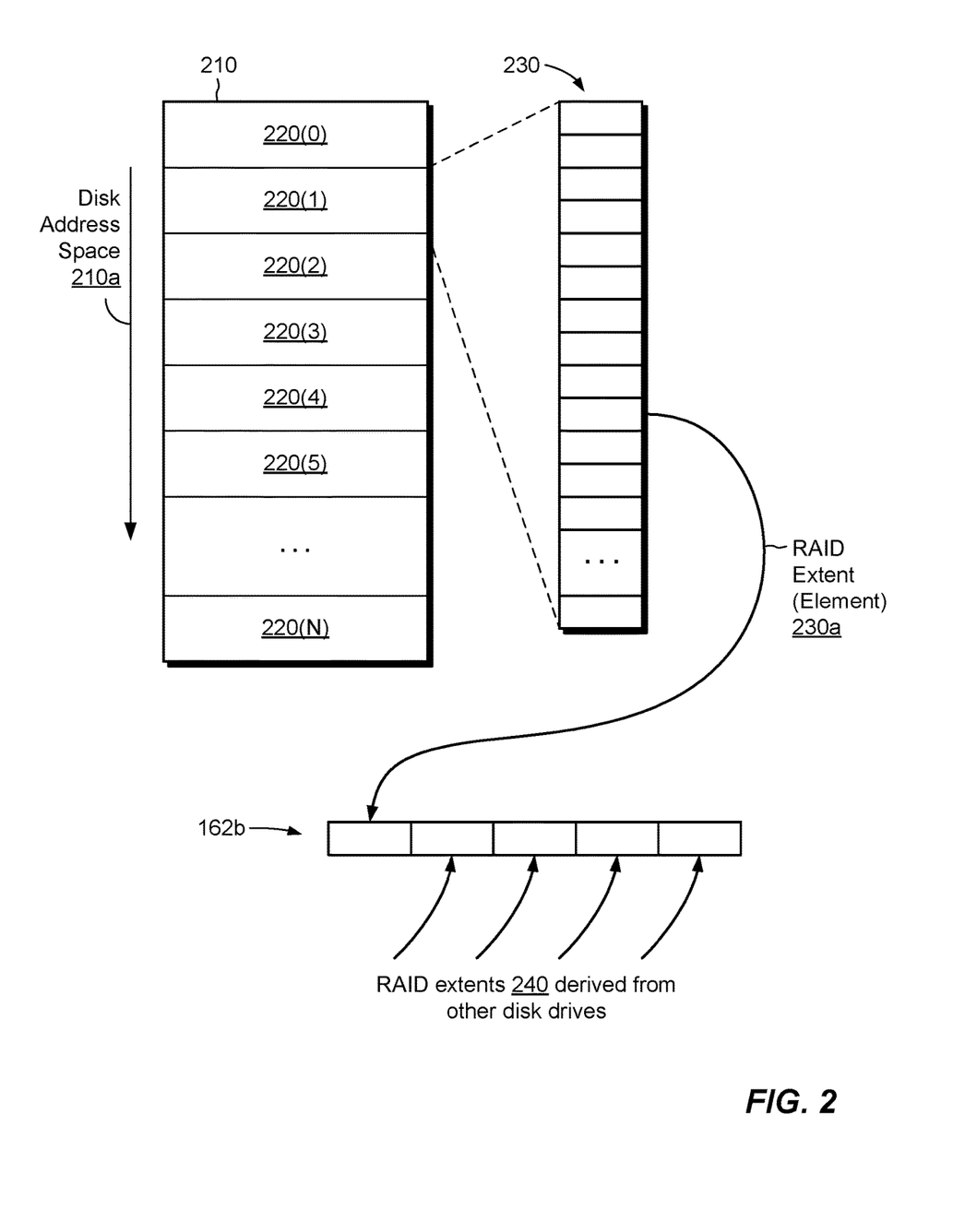
FIG. 2 is a block diagram showing an example arrangement for forming RAID stripes in the environment of FIG. 1.

FIG. 2 shows an example arrangement for constructing RAID stripes 162 from disk drives in storage 180, in accordance with example embodiments hereof. Here, a disk drive 210 (from storage 180) has a disk address space 210*a*, which may be specified using LBA (Logical Block Addressing), for example. The disk drive 210 is divided or otherwise partitioned into regions 220(0) through 220(N), where each region is a large, contiguous range of storage, which may be 256 MB or 1 GB in size, for example. As shown for region 220(1), each region 220 itself is divided or otherwise partitioned into a number of extents 230 (also called elements). In an example, each extent 230 may be 1 MB or 2 MB, for example. Extents 230 are then available to the RAID subsystem 160 in forming stripes 162. For example, RAID extent 230*a* forms a first extent in a five-member RAID stripe 162*b*, the other extents 240 of which are preferably derived from other disk drives. Any number of RAID stripes 162 may be formed in this manner, limited only by the number and capacity of disk drives in storage 180.

Figure 3:
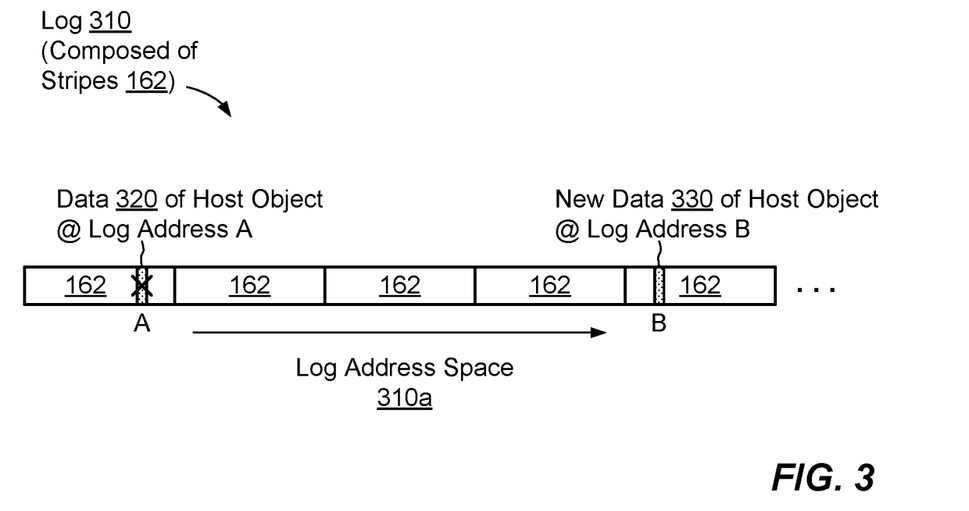
FIG. 3 is a block diagram of a write-forward log space in accordance with some embodiments hereof.

FIG. 3 shows an example log-based arrangement for organizing data storage in the data storage system 116. Here, a log 310 is composed of RAID stripes 162 arranged consecutively in a log address space 310*a*. The log 310 employs a write-forward arrangement, such that every write directed to any logical address of any data object 142 (FIG. 1) is an allocating write to a next available location. No overwrites are performed.

For example, assume that the mapping subsystem 160 writes data 320 to a particular address 310*a* of the log 310, e.g., in response to an originating host 110 directing the data 320 to a particular logical address range of a data object 142. Sometime later, the data storage system 116 receives another request to write data 330 to the same logical address in the same data object as before. Instead of overwriting the data at location A, however, the mapping subsystem 160 allocates space at a next available location B and places the data 330 in the new location. When placing the data at B, the mapping subsystem 160 invalidates the data 320 at location A. The mapping subsystem 160 updates the map metadata 152 to reflect these changes.

One should appreciate that the above-described write-forward arrangement tends to create "holes," i.e., invalidated regions, such as location A, where valid data can no longer be found. Thus, the log-based arrangement of FIG. 3 is expected to produce many empty or at least sparsely populated RAID stripes 162, which can benefit from the selective repair operations described in connection with FIG. 1.

Figure 4:
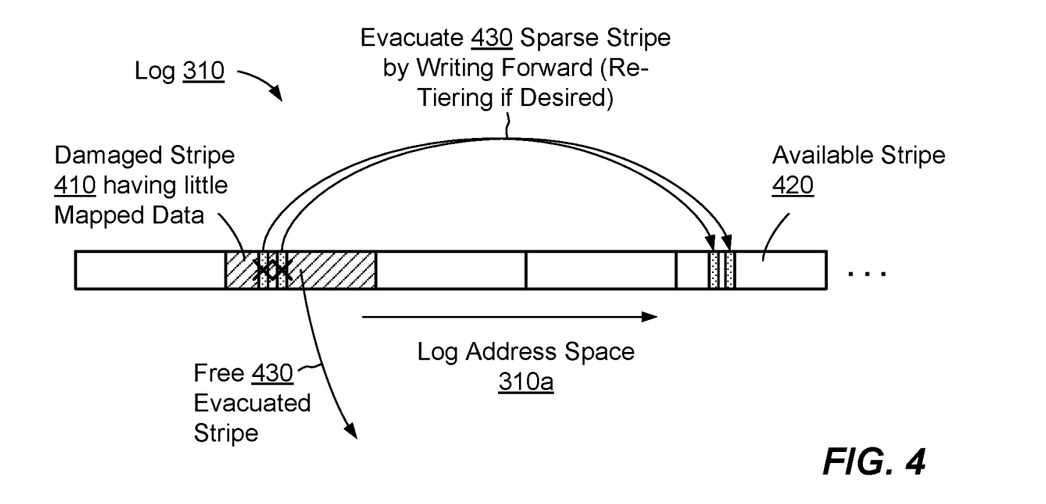
FIG. 4 is a block diagram showing data evacuation from a damaged RAID stripe in the write-forward log space of FIG. 3.

FIG. 4 shows an example arrangement for relocating data from a damaged stripe 410 (shown to the left) to an available stripe 420 (shown to the right). Here, valid data still present in damaged stripe 410 (as indicated by map metadata 152) is evacuated (arrows 430) from stripe 410 and copied to stripe 420. Relocated portions of data are then invalidated in stripe 410. Once the stripe 410 has been evacuated, the mapping subsystem 150 may free the stripe 210, in the manner already described. Map metadata 152 may be updated accordingly.

One should appreciate that stripe 420 may belong to the same storage tier as stripe 410, or it may belong to a different tier, such that relocating the data in stripe 410 also effects a re-tiering of such data. Also, as mentioned above, relocation of data may proceed in a fine-grain manner, e.g., with different data portions on stripe 410 moved to stripes belonging to different storage tiers, e.g., with some data portions tiered up and others tiered down.

Figure 5:
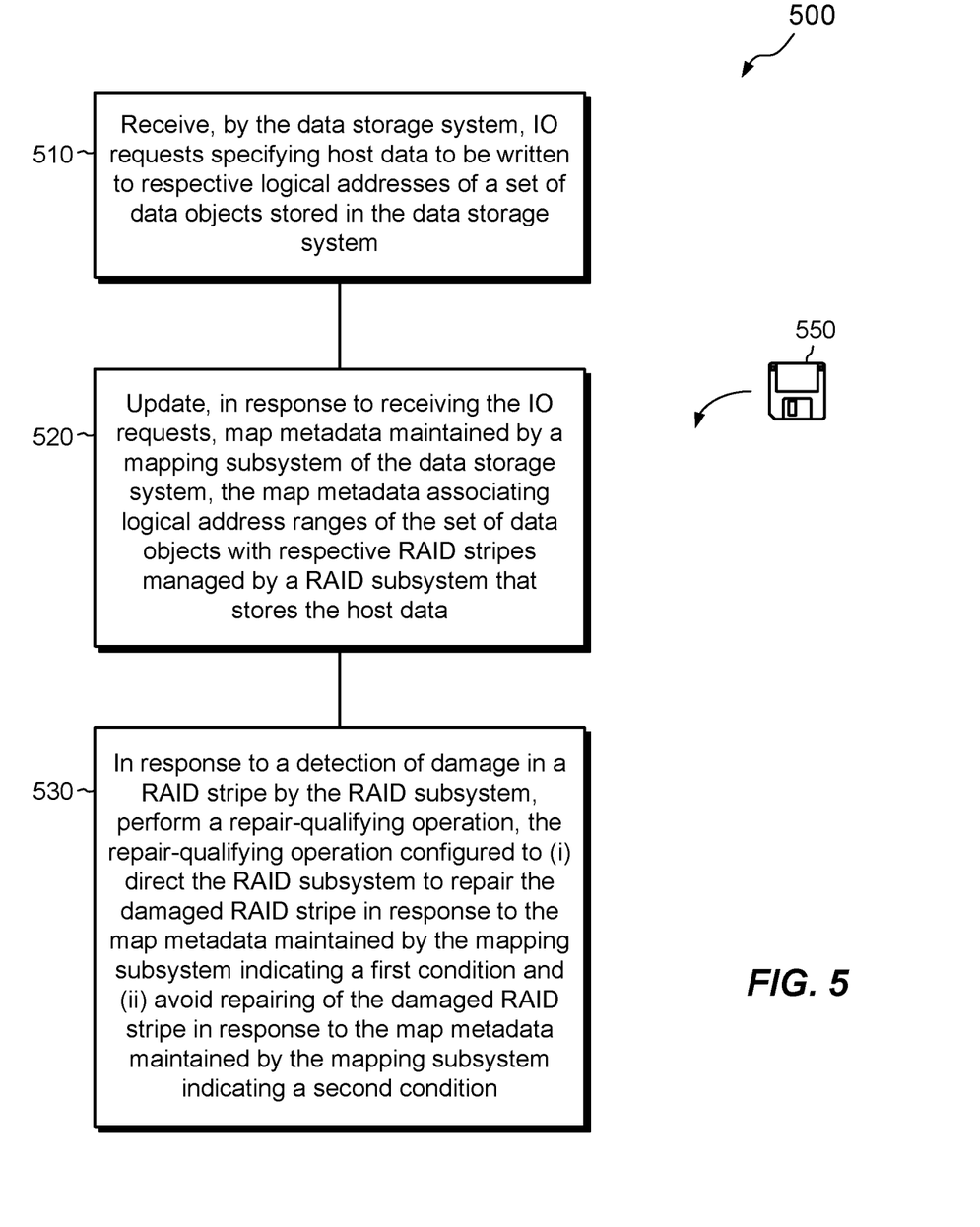
FIG. 5 is a flowchart showing an example method of managing RAID storage in a data storage system.

FIG. 5 shows an example method 500 that may be carried out in connection with the environment 100. The method 500 typically performed, for example, by the software constructs described in connection with FIG. 1, which reside in the memory 130 of the storage processor 120 and are run by the set of processors 124. The various acts of method 500 may be ordered in any suitable way. Accordingly, embodiments may be constructed in which acts are performed in orders different from that illustrated, which may include performing some acts simultaneously.

At 510, the data storage system 116 receives IO requests 112 specifying host data (from any of hosts 110) to be written to respective logical addresses (LA's) of a set of data objects 142 stored in the data storage system 116.

At 520, in response to receiving the IO requests 112, map metadata 152 maintained by a mapping subsystem 150 of the data storage system 116 is updated. The map metadata 152 associates logical address ranges of the set of data objects 142 with respective RAID stripes 162 managed by a RAID subsystem 160 that stores the host data.

At 530, in response to a detection of damage in a RAID stripe 162a by the RAID subsystem 160, a repair-qualifying operation 154 is performed. The repair-qualifying operation 154 is configured to (i) direct the RAID subsystem 160 to repair the damaged RAID stripe 162a in response to the map metadata 152 maintained by the mapping subsystem 150 indicating a first condition (as indicated by arrow 156a) and (ii) avoid repairing of the damaged RAID stripe 162a in response to the map metadata 152 maintained by the mapping subsystem 150 indicating a second condition (as indicate by arrow 156b).

Advantageously, the method 500 leverages map metadata 152 to avoid repairing damaged RAID stripes when the mapping metadata 152 indicates that better, more efficient options are available. Demands on processors and memory are reduced and a significant source of write amplification on flash drives is avoided.

Having described certain embodiments, numerous alternative embodiments or variations can be made. For example, although embodiments directed to a log-based, write-forward storage arrangement have been shown and described, this is merely an example, as the technique hereof may be applied in any storage arrangement that maps logical addresses of data objects to corresponding physical addresses in RAID stripes.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 550 in FIG. 5). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a second event may take place before or after a first event, or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of managing RAID (Redundant Array of Independent/Inexpensive Disks) storage in a data storage system, the method comprising:

receiving, by the data storage system, IO requests specifying host data to be written to respective logical addresses of a set of data objects stored in the data storage system;

updating, in response to receiving the IO requests, map metadata maintained by a mapping subsystem of the data storage system, the map metadata associating logical address ranges of the set of data objects with respective RAID stripes managed by a RAID subsystem that stores the host data; and in response to a detection of damage in a RAID stripe by the RAID subsystem, performing a repair-qualifying operation, the repair-qualifying operation configured to, based on the map metadata maintained by the mapping subsystem, selectively (i) direct the RAID subsystem to repair the damaged RAID stripe in response to the map metadata indicating a first condition and (ii) avoid repairing of the damaged RAID stripe in response to the map metadata indicating a second condition, wherein the repair-qualifying operation is configured to determine whether to repair the damaged RAID stripe based on the map metadata.

2. The method of claim 1, wherein the map metadata indicates the second condition in response to the map metadata associating no greater than a predetermined amount of host data with the damaged RAID stripe.

3. The method of claim 2, wherein the map metadata indicates the second condition, resulting in the repair-qualifying operation avoiding repair of the damaged RAID stripe, in response to the map metadata associating no host data with the damaged RAID stripe.

4. The method of claim 2, wherein the method further comprises, in response to the map metadata associating no greater than the predetermined amount of host data with the damaged RAID stripe: directing the RAID subsystem to relocate the host data stored in the damaged RAID stripe in a set of other RAID stripes managed by the RAID subsystem; updating the map metadata to associate logical address ranges of the relocated host data with the set of other RAID stripes; and freeing the damaged RAID stripe.

5. The method of claim 4, wherein the damaged RAID stripe is built from multiple storage extents derived from respective flash drives.

6. The method of claim 5, wherein the map metadata further associates logical address ranges of the set of data objects with respective data temperatures, the data temperature of one logical address range in the map metadata having a first value in response to that logical address range being read relatively frequently, the data temperature of another logical address range in the map metadata having a second value in response to the other logical address range being read relatively infrequently.

7. The method of claim 6, wherein the RAID subsystem supports multiple storage tiers, each storage tier providing a respective quality of service, wherein the data storage system performs storage tiering to place host data on storage tiers based on data temperature, wherein the damaged RAID stripe belongs to a first storage tier, and wherein directing the RAID subsystem to relocate host data stored in the damaged RAID stripe to a set of other RAID stripes managed by the RAID subsystem includes:
  identifying, from the map metadata, the data temperature of a set of host data stored in the damaged RAID stripe; and
  in response to the data temperature of the set of host data being more consistent with placement on a second storage tier than with placement on the first storage tier, relocating the set of data stored in the damaged RAID stripe to a RAID stripe belonging to the second storage tier.

8. The method of claim 1,
  wherein the map metadata further associates logical address ranges of the set of data objects with respective data temperatures, the data temperature of one logical address range in the map metadata having a first value in response to that logical address range being read relatively frequently, the data temperature of another logical address range in the map metadata having a second value in response to the other logical address range being read relatively infrequently,
  wherein the RAID subsystem supports multiple storage tiers, each storage tier providing a respective quality of service, the damaged RAID stripe belonging to a first storage tier,
  wherein the map metadata indicates the second condition, resulting in the repair-qualifying operation avoiding repair of the damaged RAID stripe, in response to the data temperature of a set of host data stored in the damaged RAID stripe being more suitable for placement in a second storage tier than in the first storage tier, and
  wherein the method further comprises (i) rebuilding the set of host data onto a RAID stripe belonging to the second storage tier; and (ii) freeing the damaged RAID stripe.

9. The method of claim 1, wherein the RAID subsystem arranges RAID stripes from multiple disk drives by partitioning each disk drive into regions, partitioning each region into extents, and combining extents from regions of respective disk drives to form RAID stripes, each RAID stripe thereby formed from multiple extents derived from respective disk drives.

10. The method of claim 1,
  wherein the map metadata, which associates logical address ranges of the set of data objects with respective RAID stripes, further associates logical address ranges of the set of data objects with respective RAID address ranges in the RAID subsystem, each RAID address range identifying a respective portion of storage smaller than a RAID stripe, and
  wherein the method further comprises performing fine-grain repair-qualifying operations at RAID-address-range granularity, the fine-grain repair-qualifying operations each configured to (i) direct the RAID subsystem to rebuild data at a respective RAID address range in response to the map metadata indicating one condition and (ii) avoid rebuilding the data at the respective RAID address in response to the map metadata indicating another condition.

11. The method of claim 10, wherein the map metadata indicates the other condition when the data stored at the respective RAID address range is no longer used to support any data object in the data storage system.

12. The method of claim 10, wherein the map metadata indicates the other condition when the data stored at the respective RAID address range has been marked for placement on a different storage tier from the storage tier on which it is currently placed.

13. The method of claim 10, wherein the map metadata indicates the other condition when the data stored at the respective RAID address range has been marked for deletion.

14. The method of claim 1, wherein the set of data objects includes at least one of (i) a host-accessible LUN (Logical UNit), (ii) a host-accessible file system, or (iii) a virtual machine disk, and wherein the logical address ranges that the map metadata associates with the respective RAID stripes include logical address ranges of the host-accessible LUN, host-accessible file system, or virtual machine disk.

15. A data storage system, comprising control circuitry that includes a set of processing units coupled to memory, the control circuitry constructed and arranged to:
  receive, by the data storage system, IO requests specifying host data to be written to respective logical addresses of a set of data objects stored in the data storage system;
  update, in response to receiving the IO requests, map metadata maintained by a mapping subsystem of the data storage system, the map metadata associating logical address ranges of the set of data objects with respective RAID (Redundant Array of Independent/Inexpensive Disks) stripes managed by a RAID subsystem that stores the host data; and
  in response to a detection of damage in a RAID stripe by the RAID subsystem, perform a repair-qualifying operation, the repair-qualifying operation configured to selectively (i) direct the RAID subsystem to repair the damaged RAID stripe in response to the map metadata maintained by the mapping subsystem indicating a first condition and (ii) avoid repairing of the damaged RAID stripe in response to the map metadata maintained by the mapping subsystem indicating a second condition, wherein the repair-qualifying operation is configured to determine whether to repair the damaged RAID stripe based on the map metadata.

16. A computer program product including a set of non-transitory, computer-readable media having instructions which, when executed by control circuitry of a data storage system, cause the control circuitry to perform a method for managing RAID (Redundant Array of Independent/Inexpensive Disks) storage, the method comprising:

receiving, by the data storage system, IO requests specifying host data to be written to respective logical addresses of a set of data objects stored in the data storage system;

updating, in response to receiving the IO requests, map metadata maintained by a mapping subsystem of the data storage system, the map metadata associating logical address ranges of the set of data objects with respective RAID stripes managed by a RAID subsystem that stores the host data; and in response to a detection of damage in a RAID stripe by the RAID subsystem, performing a repair-qualifying operation, the repair-qualifying operation configured to selectively (i) direct the RAID subsystem to repair the damaged RAID stripe in response to the map metadata maintained by the mapping subsystem indicating a first condition and (ii) avoid repairing of the damaged RAID stripe in response to the map metadata maintained by the mapping subsystem indicating a second condition, the repair-qualifying operation thereby configured to determine whether to repair the damaged RAID stripe based on the map metadata.

17. The computer program product of claim 16, wherein the RAID subsystem arranges RAID stripes from multiple disk drives by partitioning each disk drive into regions, partitioning each region into extents, and combining extents from regions of respective disk drives to form RAID stripes, each RAID stripe thereby formed from multiple extents derived from respective disk drives.

18. The computer program product of claim 16, wherein the map metadata, which associates logical address ranges of the set of data objects with respective RAID stripes, further associates logical address ranges of the set of data objects with respective RAID address ranges in the RAID subsystem, each RAID address range identifying a respective portion of storage smaller than a RAID stripe, and wherein the method further comprises performing fine-grain repair-qualifying operations at RAID-address-range granularity, the fine-grain repair-qualifying operations each configured to (i) direct the RAID subsystem to rebuild data at a respective RAID address range in response to the map metadata indicating one condition and (ii) avoid rebuilding the data at the respective RAID address in response to the map metadata indicating another condition.

19. The computer program product of claim 18, wherein the map metadata indicates the other condition when the data stored at the respective RAID address range is no longer used to support any data object in the data storage system.

20. The computer program product of claim 18, wherein the map metadata indicates the other condition when the data stored at the respective RAID address range has been marked for placement on a different storage tier from the storage tier on which it is currently placed.

21. The computer program product of claim 18, wherein the map metadata indicates the other condition when the data stored at the respective RAID address range has been marked for deletion.

* * * * *